United States Patent
Manabe et al.

(10) Patent No.: US 10,062,722 B2
(45) Date of Patent: Aug. 28, 2018

(54) STACKED IMAGE SENSOR WITH SHIELD BUMPS BETWEEN INTERCONNECTS

(71) Applicant: OMNIVISION TECHNOLOGIES, INC., Santa Clara, CA (US)

(72) Inventors: Sohei Manabe, San Jose, CA (US); Keiji Mabuchi, Los Altos, CA (US); Takayuki Goto, Foster City, CA (US); Vincent Venezia, Los Gatos, CA (US); Boyd Albert Fowler, Sunnyvale, CA (US); Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 139 days.

(21) Appl. No.: 15/284,961

(22) Filed: Oct. 4, 2016

(65) Prior Publication Data
US 2018/0097030 A1    Apr. 5, 2018

(51) Int. Cl.
*H01L 27/148*    (2006.01)
*H01L 27/146*    (2006.01)

(52) U.S. Cl.
CPC .. *H01L 27/14634* (2013.01); *H01L 27/14612* (2013.01); *H01L 27/14632* (2013.01); *H01L 27/14636* (2013.01); *H01L 27/14643* (2013.01)

(58) Field of Classification Search
CPC .................................. H01L 27/146–27/14893
USPC ........................................................ 257/233
See application file for complete search history.

(56) References Cited

U.S. PATENT DOCUMENTS

| | | | | |
|---|---|---|---|---|
| 5,760,431 A | * | 6/1998 | Savoye | H01L 27/14831 257/240 |
| 7,217,601 B1 | * | 5/2007 | Burke | H01L 29/66954 257/E21.457 |
| 7,965,329 B2 | | 6/2011 | McCarten et al. | |
| 2004/0217264 A1 | * | 11/2004 | Wood | G01B 11/272 250/214 R |
| 2015/0123225 A1 | * | 5/2015 | Chien | H01L 27/14627 257/432 |
| 2016/0173803 A1 | * | 6/2016 | Fukuoka | H01L 27/14623 348/302 |

* cited by examiner

*Primary Examiner* — Kevin M Picardat
(74) *Attorney, Agent, or Firm* — Christensen O'Connor Johnson Kindness PLLC

(57) ABSTRACT

An image sensor includes a pixel array having plurality of pixel cells arranged into a plurality of rows and a plurality of columns of pixel cells in a first semiconductor die. A plurality of pixel support circuits are arranged in a second semiconductor die that is stacked and coupled together with the first semiconductor die. A plurality of interconnect lines are coupled between the first and second semiconductor dies, and each one of the plurality of pixel cells is coupled to a corresponding one of the plurality of pixel support circuits through a corresponding one plurality of interconnect lines. A plurality of shield bumps are disposed proximate to corners of the pixel cells in the pixel array and between the first and second semiconductor dies such that each one of the plurality of shield bumps is disposed between adjacent interconnect lines along a diagonal of the pixel array.

17 Claims, 4 Drawing Sheets

STACKED IMAGE SENSOR WITH SHIELD BUMPS BETWEEN INTERCONNECTS

BACKGROUND INFORMATION

Field of the Disclosure

This invention is related to image sensors. In particular, embodiments of the present invention are related to stacked image sensors.

Background

Image sensors have become ubiquitous. They are widely used in digital cameras, cellular phones, security cameras, as well as, medical, automobile, and other applications. The technology used to manufacture image sensors, and in particular, complementary metal-oxide-semiconductor (CMOS) image sensors, has continued to advance at great pace. For example, the demands of higher resolution and lower power consumption have encouraged the further miniaturization and integration of these image sensors.

In conventional stacked image sensors, the photodiodes of pixels are typically on a first die, and the pixel support circuits are on a second die that is stacked together with the first die that includes the photodiodes. Interconnection lines are provided between the first and second dies in order to provide electrical connections between the photodiodes on the first die and the corresponding pixel support circuits on the second die.

One of the challenges presented with conventional stacked image sensors is the unwanted capacitive coupling that exists between the adjacent interconnection lines between the first and second dies of the stacked image sensors that connect the photodiodes to the pixel support circuits. The capacitive coupling between the adjacent interconnection lines can cause interference or result in other unwanted consequences between adjacent interconnection lines when reading out image data from the photodiodes.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
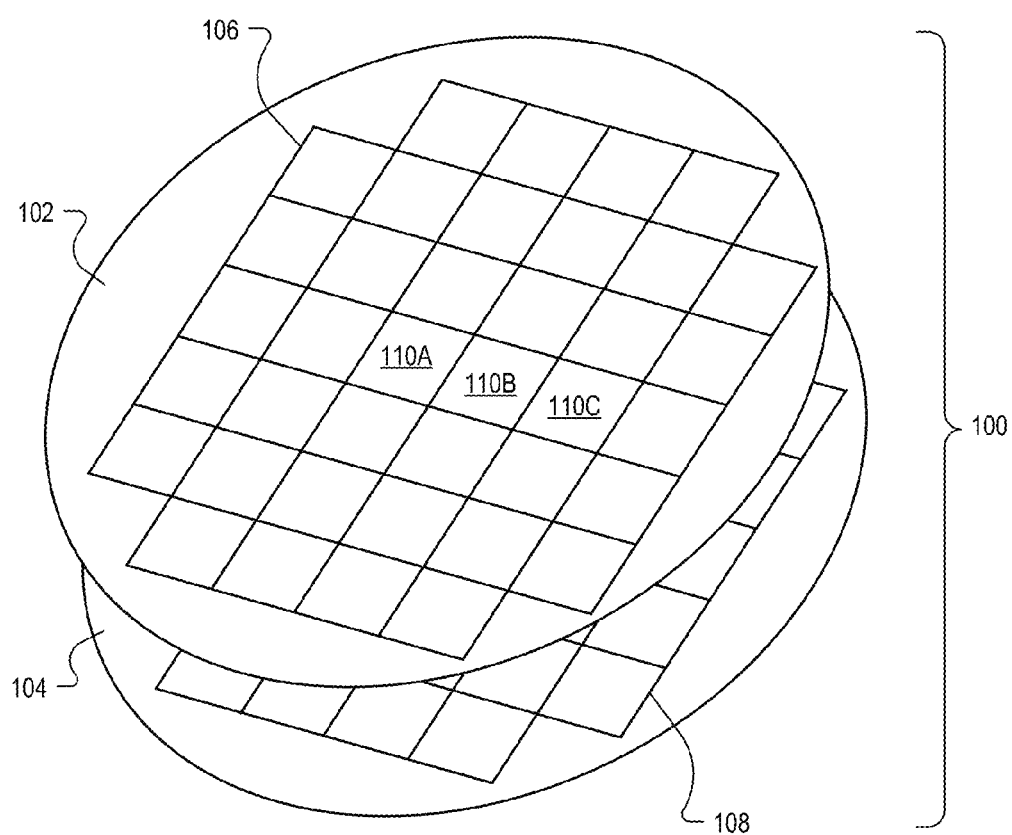
FIG. 1 is an exploded view of one example of a stacked imaging system including stacked semiconductor device wafers providing a stacked image sensor with shield bumps between interconnections along the diagonals of the image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise. It should be noted that element names and symbols may be used interchangeably through this document (e.g., Si vs. silicon); however, both have identical meaning.

As will be shown, an example of a stacked image sensor in accordance with the teachings of the present invention includes a two dimensional array of pixels arranged in a first semiconductor die that are coupled through interconnect lines to pixel support circuitry disposed in a second semiconductor die that is stacked with the first semiconductor die. In various examples, the pixels may be arranged in groupings, such as shared pixel cells. For instance, the pixels are arranged into groupings such that there are shield bumps disposed in the interconnect layer in the corners of the groupings of the shared pixel cells. In various examples, the shield bumps may be dummy interconnect lines, power supply lines, ground lines, or the like. As such, there are shield bumps between the interconnections lines of the shared pixel cells to the pixel support circuitry, which are read out simultaneously along diagonals of the pixel array in accordance with the teachings of the present invention.

For instance, as will be disclosed in one example of a readout scheme in accordance with the teachings of the present invention, every other shared pixel cell of two rows of shared pixel cells of the pixel array are read out at a time such that the shared pixel cells are read out simultaneously along diagonals of the pixel array. Since the shared pixel cells are read out simultaneously along diagonals of the pixel array, there are shield bumps between adjacent shared pixel cells that are being read out along the diagonal of the pixel array. With the shielding provided by the shield bumps in the corners of the pixel groupings, the unwanted effects caused by the capacitive coupling between adjacent interconnection lines along a row of the pixel array can be avoided when reading out pixel data from the pixel array in accordance with the teachings of the present invention.

To illustrate, FIG. 1 is an exploded view of one example of stacked semiconductor dies 102 and 104 of an example stacked imaging system 100 in accordance with the teachings of the present invention. In various examples, semiconductor dies 102 and 104 are stacked device wafers that may include silicon, gallium arsenide, or other suitable semiconductor materials. In the illustrated example, semiconductor die 102 is a sensor die that includes a pixel array 106 having a plurality of pixel cells 110A, 110B, 110C, etc., and semiconductor die 104 is a logic die that includes corresponding pixel support circuits to support operation of the pixel cells in pixel array 106 in accordance with the teachings of the present invention. In one example, pixel cells 110A, 110B, and 110C may be shared pixel cells. As shown, semiconductor die 102, which includes pixel array 106, is stacked with and coupled to semiconductor die 104.

As will be discussed in more detail below, the plurality of shared pixel cells 110A, 110B, 110C, etc., of pixel array 106 are coupled to the pixel support circuits 108 through interconnection lines (as will be shown for example in FIG. 2) that are coupled between semiconductor die 102 and semiconductor die 104. As will be shown, pixel cells 110A, 110B, 110C, etc., of pixel array 106 are arranged into groupings such that there are shield bumps (as will be shown for example in FIG. 2) disposed in the interconnect layer in the corners of the groupings of shared pixel cells 110A, 110B, 110C, etc., such that there are shield bumps between the interconnections lines of the shared pixel cells 110A, 110B, 110C, etc., along diagonals of pixel array 106 to the pixel support circuits 108. In various examples, every other shared pixel cell of two rows of pixel array 106 are read out at a time such that the shared pixel cells are read out simultaneously only along diagonals of the pixel array. Since the shared pixel cells are read out simultaneously only along diagonals of pixel array 106, there are shield bumps between adjacent shared pixel cells that are being read out along the diagonal of the pixel array. With the shielding provided by the shield bumps in the corners of the pixel groupings, the unwanted effects caused by the capacitive coupling between adjacent interconnection lines along the same row of the pixel array can be avoided when reading out pixel data from the pixel array in accordance with the teachings of the present invention.

Figure 2:
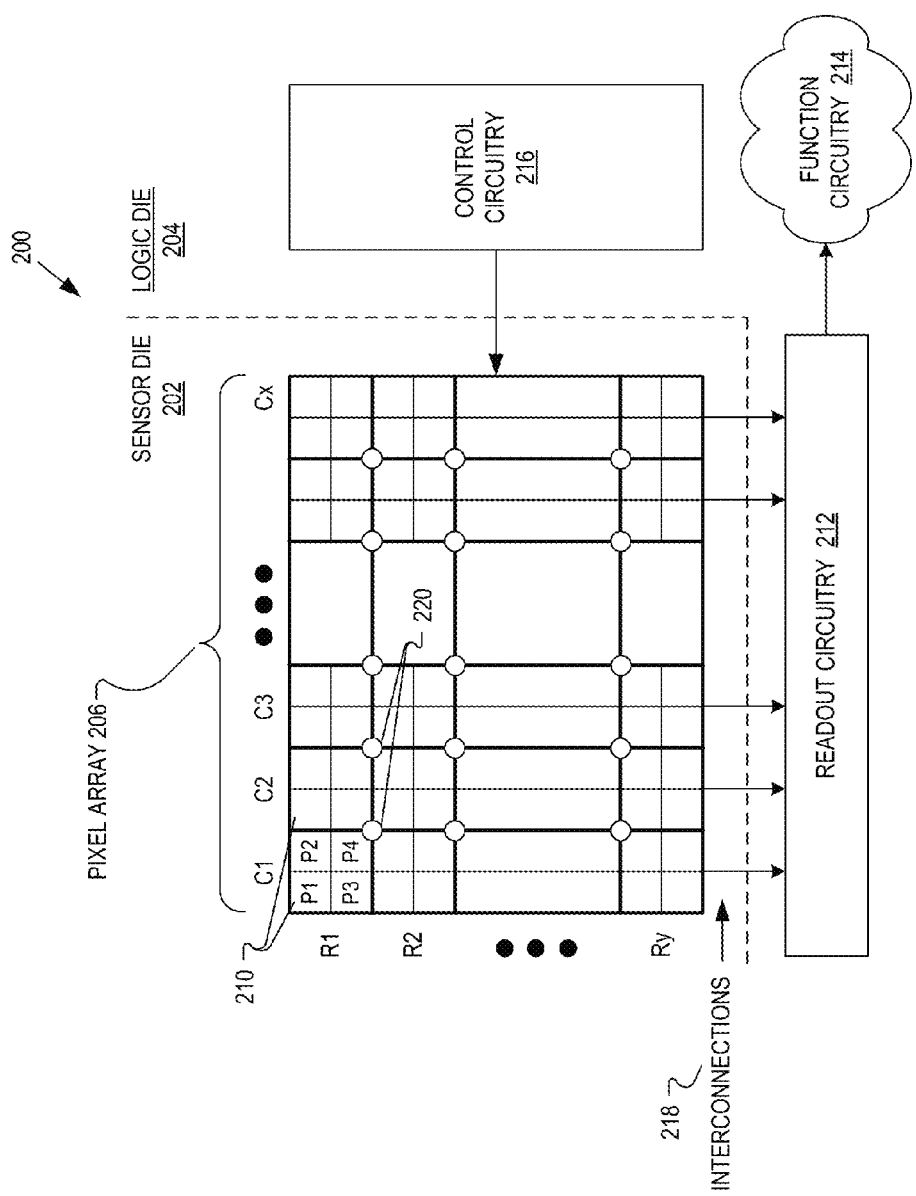
FIG. 2 is a block diagram illustrating an imaging system implemented as a stacked image sensor including a pixel array having shared pixel cells arranged in a first semiconductor die that are coupled through interconnections to pixel support circuits in a second semiconductor die with shield bumps between the interconnections along the diagonals of the pixel array in accordance with the teachings of the present invention.

To illustrate, FIG. 2 is a block diagram illustrating a stacked imaging system 200 in accordance with the teachings of the present invention. It is noted that the stacked imaging system 200 of FIG. 2 may be an example of the stacked imaging system 100 shown in FIG. 1, and therefore it should be appreciated that similarly named and numbered elements referenced below are coupled and function as described above. For instance, in one example, stacked imaging system 200 includes a first semiconductor die, labeled sensor die 202, that is stacked with and coupled to a second semiconductor die, labeled logic die 204. In one example, sensor die 202 includes a pixel array 206 arranged into groupings of shared pixels 210, and logic die 204 includes readout circuitry 212 coupled to read out image data from the groupings of shared pixels 210 through interconnections 218. In the depicted example, logic die 204 also includes function circuitry 214 coupled to the readout circuitry 212, and control circuitry 216 coupled to the pixel array 206.

As shown in the example illustrated in FIG. 2, pixel array 206 is a two dimensional (2D) pixel array of groupings of shared pixels 210 of an image sensor. For instance, in the example illustrated in FIG. 2, each shared pixel 210 is a 2×2 shared pixel. In the example, each shared pixel 210 includes a plurality of photodiodes (e.g., 4 photodiodes, P1/P2/P3/P4) that share a floating diffusion coupled to an interconnection 218. In the depicted example, an output bitline is coupled to be read out through each interconnection 218 by the readout circuitry in the logic die 204. As illustrated, each photodiode (e.g., P1/P2/P3/P4) of each shared pixel 210 in pixel array 206 is arranged into a row (e.g., rows R1 to Ry) and a column (e.g., column C1 to Cx) to acquire image data for an image of a person, place, object, etc., which can then be used to render a 2D image of the person, place, object, etc., in accordance with the teachings of the present invention.

As shown in the depicted example, stacked imaging system 200 also includes a plurality of shield bumps 220 that are disposed in corners of the pixel groupings 210. In various examples, the shield bumps may be dummy interconnect lines, power supply lines, ground lines, or the like. As such, there are shield bumps 220 between the interconnections lines 218 of the shared pixels 210 that are read out simultaneously only along diagonals of the pixel array 206 in accordance with the teachings of the present invention. Stated in another way, every other shared pixel cell 210 of two rows of pixel array 206 are read out at a time such that the shared pixel cells 210 are read out simultaneously only along diagonals of the pixel array 206. Since the shared pixel cells 210 are read out simultaneously along diagonals of the pixel array 206, there are shield bumps 220 between adjacent shared pixel cells 210 that are being read out along the diagonal of the pixel array 206. With the shielding provided by the shield bumps 220 in the corners of the pixel groupings 210, the unwanted effects caused by the capacitive coupling between adjacent interconnection lines along the same row of the pixel array 206 can be avoided when reading out pixel data from the pixel array 206 in accordance with the teachings of the present invention.

The pixel data is therefore read out from the photodiodes (e.g., P1/P2/P3/P4) of each shared pixel 210 in pixel array 206 through interconnections 218 to readout circuitry 212, and is then transferred to function circuitry 214. In various examples, readout circuitry 212 may include amplification circuitry, analog-to-digital (ADC) conversion circuitry, or the like. Function circuitry 214 may include digital circuitry and may simply store the image data or even manipulate the image data with image signal processing techniques to apply post image effects (e.g., crop, rotate, remove red eye, adjust brightness, adjust contrast, or otherwise).

As mentioned, control circuitry 216 is coupled to pixel array 206 to control the operational characteristics of pixel array 206. For example, control circuitry 216 may generate control signals, such as the transfer gate control signals, as well as for example, reset signals, select signals, shutter signals, and other control signals coupled to pixel array 206 to control image acquisition. In one example, the shutter signal is a global shutter signal for simultaneously enabling all pixel cells within pixel array 206 to simultaneously capture their respective image data during a single acquisition window. In another example, the shutter signal is a rolling shutter signal such that each row, column, or group of pixels is sequentially enabled during consecutive acquisition windows.

Figure 3:
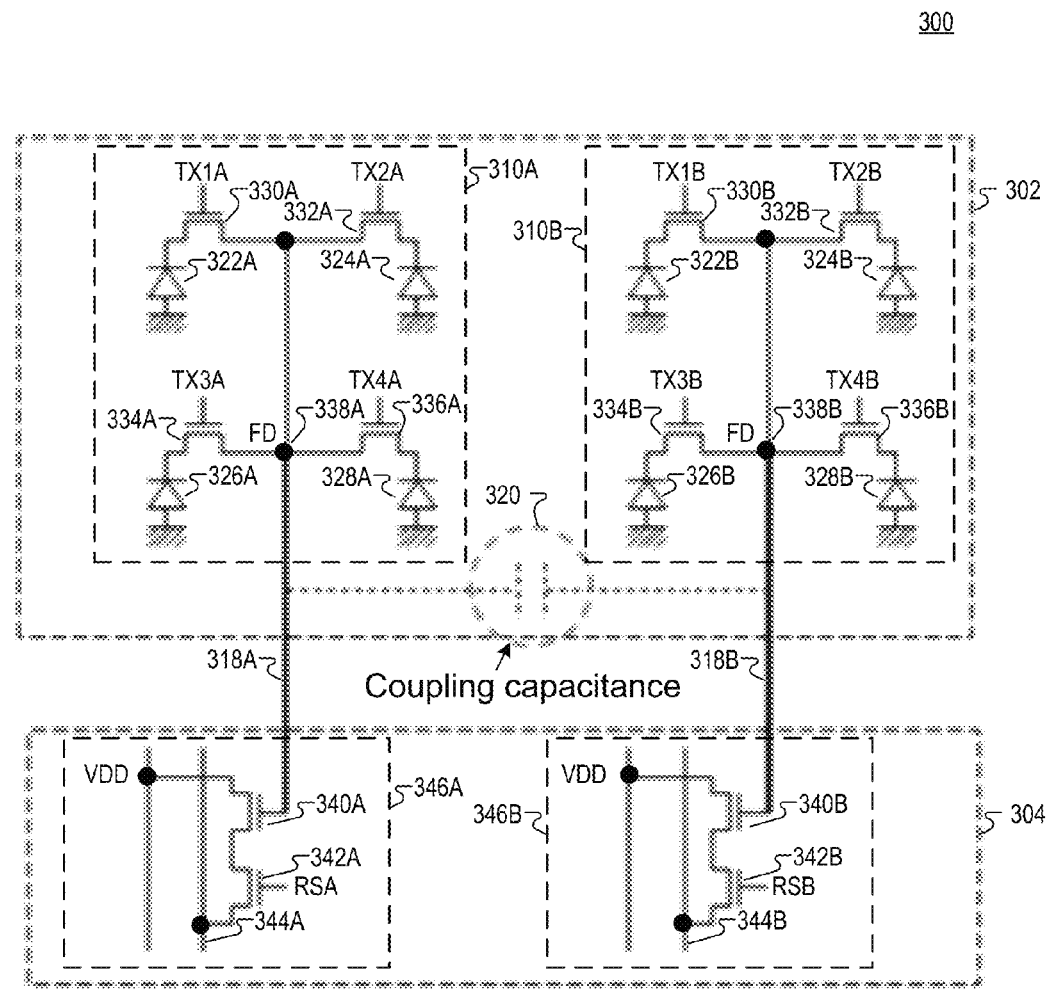
FIG. 3 shows one example schematic along a row of pixels in a pixel array of a stacked image sensor in which there is a coupling capacitance between adjacent interconnection lines along the rows of the pixel array in accordance with the teachings of the present invention.

FIG. 3 shows one example schematic along a row of shared pixel cells in a pixel array of a stacked imaging system 300 that illustrates the coupling capacitance exists between adjacent interconnection lines along the same row. It is noted that the stacked imaging system 300 of FIG. 3 may be an example of the stacked imaging system 100 shown in FIG. 1, and/or the stacked imaging system 200 of FIG. 2, and therefore it should be appreciated that similarly named and numbered elements referenced below are coupled and function as described above. For instance, as shown in the illustration, stacked imaging system 300 includes a first semiconductor die 302 that is stacked with and coupled to a second semiconductor die 304. In the depicted example, a first shared pixel cell 310A and a second shared pixel cell 310B are included along the same row in first semiconductor die 302, and pixel support circuitry 346A and pixel support circuitry 346B are included in second semiconductor die 304. First shared pixel cell 310A is coupled to pixel support circuitry 346A through interconnection line 318A, and second shared pixel cell 310B is coupled to pixel support circuitry 346B through interconnection line 318B.

As shown in the depicted example, first shared pixel 310A is illustrated as including four photodiodes 322A, 324A, 326A, and 328A, which are coupled to a floating diffusion FD 338A through transfer transistors 330A, 332A, 334A, and 336A, respectively. In operation, incident light is directed into photodiodes 322A, 324A, 326, and 328A to photogenerate image charge. The image charge that is photogenerated in photodiodes 322A, 324A, 326A, and 328A is transferred to floating diffusion FD 338A through transfer transistors 330A, 332A, 334A, and 336A in response to transfer control signals TX1A, TX2A, TX3A, and TX4A, respectively. In the example, the image charge that is transferred to floating diffusion FD 338A is coupled to pixel support circuitry 346A from first semiconductor die 302 to second semiconductor die 304 through interconnection line 318A. In particular, as shown in the depicted example, interconnection line 318A is coupled to a gate terminal of a source follower coupled amplifier transistor 340A, which is coupled to amplify the image data received from the interconnection line 318A. In the example, the drain terminal of the source follower coupled amplifier transistor 340A is coupled to a supply voltage VDD, and the source terminal is coupled to a row select transistor 342A. The image data that is amplified by the source follower coupled amplifier transistor 340A is coupled to an output bitline 344A through row select transistor 342A in response to a row select control signal RSA. In one example, the output bitline 344A is coupled to be read out through readout circuitry, such as for example readout circuitry 212 of FIG. 2.

Similarly, as further shown in the depicted example of FIG. 3, second shared pixel 310B is illustrated as including four photodiodes 322B, 324B, 326B, and 328B, which are coupled to a floating diffusion FD 338B through transfer transistors 330B, 332B, 334B, and 336B, respectively. In operation, incident light is also directed into photodiodes 322B, 324B, 326B, and 328B to photogenerate image charge. The image charge that is photogenerated in photodiodes 322B, 324B, 326B, and 328A is transferred to floating diffusion FD 338B through transfer transistors 330B, 332B, 334B, and 336B in response to transfer control signals TX1B, TX2B, TX3B, and TX4B, respectively. In the example, the image charge that is transferred to floating diffusion FD 338B is coupled to pixel support circuitry 346B from first semiconductor die 302 to second semiconductor die 304 through interconnection line 318B. In particular, as shown in the depicted example, interconnection line 318B is coupled to a gate terminal of a source follower coupled amplifier transistor 340B, which is coupled to amplify the image data received from the interconnection line 318B. In the example, the drain terminal of the source follower coupled amplifier transistor 340B is coupled to supply voltage VDD, and the source terminal is coupled to a row select transistor 342B. The image data that is amplified by the source follower coupled amplifier transistor 340B is coupled to an output bitline 344B through row select transistor 342B in response to a row select control signal RSB. In one example, the output bitline 344B is coupled to be read out through readout circuitry, such as for example readout circuitry 212 of FIG. 2.

As mentioned, it is appreciated that the first shared pixel 310A and second shared pixel 310B are in the same row of a pixel array, such as for example row R1 of pixel array 206 of FIG. 2. As such, the interconnection line 318A that is coupled to shared pixel 310A is adjacent to interconnection line 318B coupled to shared pixel 310B along the same row. Furthermore, there is no shield bump between interconnection line 318A and adjacent interconnection line 318B. Since there is an absence of a shield bump between interconnection line 318A and interconnection line 318B, there is instead an unwanted coupling capacitance 320 between interconnection line 318A and interconnection line 318B, which causes unwanted interference when reading out image data from first shared pixel cell 310A and second shared pixel cell 310B.

Figure 4:
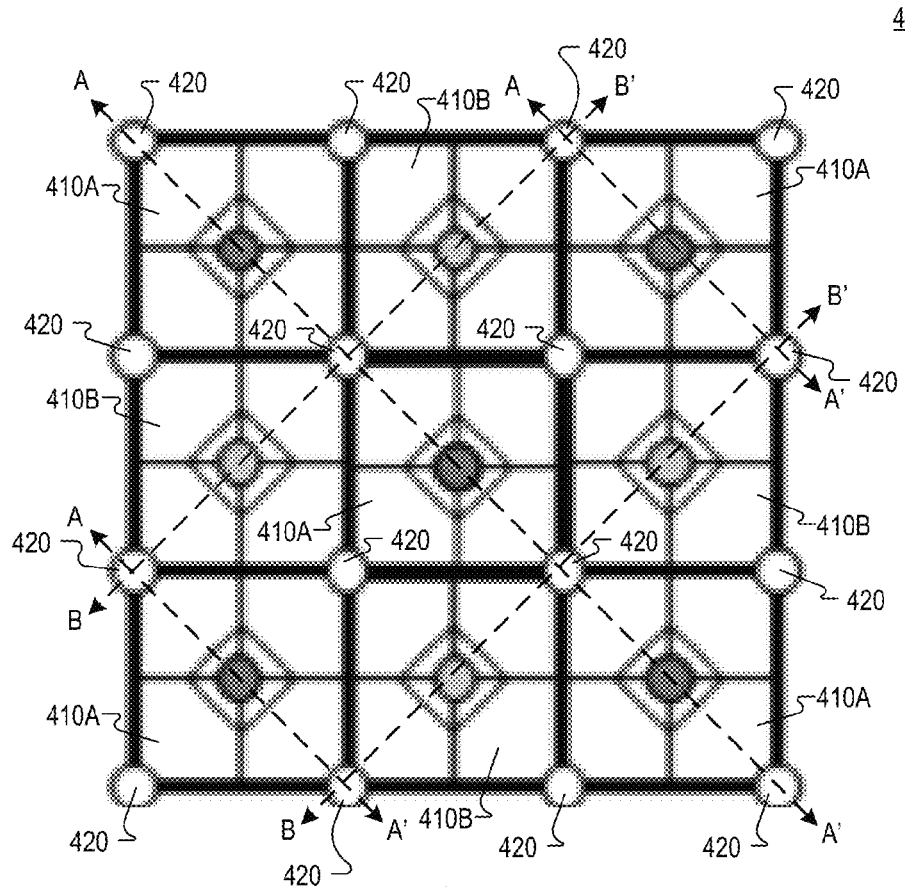
FIG. 4 is a block diagram illustrating an example pixel array with shield bumps disposed in corners of the pixel groupings such that there are shield bumps between the interconnections lines of pixel groupings that are read out simultaneously along diagonals of the pixel array in accordance with the teachings of the present invention.

FIG. 4 is a block diagram illustrating an example pixel array 406 with shield bumps disposed in the corners of the pixel groupings, such that there are shield bumps between the interconnections lines of pixel groupings that are read out simultaneously only along diagonals of the pixel array in accordance with the teachings of the present invention. It is noted that the pixel array 406 of FIG. 4 may be an example of the pixel array 106 shown in FIG. 1, and/or the pixel array 206 of FIG. 2, etc., and therefore it should be appreciated that similarly named and numbered elements referenced below are coupled and function as described above. In particular, the example depicted in FIG. 4 shows pixel array 406 including plurality of pixels cells 410A and 410B that are alternatingly arranged in a checkerboard pattern into a plurality of rows and a plurality of columns as shown. In one example, the pixel cells are shared pixels including for example four photodiodes, similar to for instance the example described in FIG. 3. In the example, pixel array 406 is included in a first semiconductor die that is stacked with and coupled to a semiconductor die that includes pixel support circuitry coupled to pixel array 406 through interconnects in accordance with the teachings of the present invention.

As shown in the depicted example, pixel array 406 also includes a plurality of shield bumps 420, which are disposed proximate to corners of the pixel cells 410A and 410B. In various examples, the shield bumps may be dummy interconnect lines, power supply lines, ground lines, or the like. As such, each one of the plurality of shield bumps 410 is disposed between adjacent interconnect lines coupled to the pixel cells 410A and 410B along diagonals of the pixel array 406 in accordance with the teachings of the present invention. To illustrate, the diagonals from the upper left towards the lower right through pixel cells 410A are labeled with dashed lines A-A'. Similarly, the diagonals from the lower left towards the upper right through pixel cells 410B are labeled with dashed lines B-B'. Therefore, each one of the plurality of shield bumps 420 is disposed between adjacent interconnect lines that are coupled to shared pixel cells 410A and 410B along diagonals A-A' or B-B' of the pixel array 406 in accordance with the teachings of the present invention.

In operation, the shield bumps 420 are adapted to shield a coupling capacitance between adjacent interconnect lines that are coupled to pixel cells 410A and 410B along the diagonals A-A' and B-B' of the pixel array 406 in accordance with the teachings of the present invention. Thus, in one example, during read out of pixel array 406, every other pixel cell 410A, and then remaining every other pixel cell 410B, in two rows at a time of the pixel array 406 are read out such that there is a shield bump 420 disposed between the interconnect lines of the pixel cells from the two rows of the pixel array 406 that are being read out at that time.

For example, during a first read out pass, every other pixel cell 410A (e.g., along diagonals A-A') of two rows of pixel array 406 are read out simultaneously. Accordingly, there is a shield bump 420 between the interconnection line of each adjacent pixel cell 410A that is being read out to eliminate or substantially reduce the coupling capacitance between the two adjacent interconnection lines along diagonals A-A' in accordance with the teachings of the present invention.

Subsequently, during a next read out pass, every other pixel cell 410B (e.g., along diagonals B-B') of two rows of pixel array 406 are read out simultaneously. Accordingly, there is a shield bump 420 between the interconnection line of each adjacent pixel cell 410B that is being read out to eliminate or substantially reduce the coupling capacitance between the two adjacent interconnection lines along diagonals B-B' in accordance with the teachings of the present invention.

Figure 5:
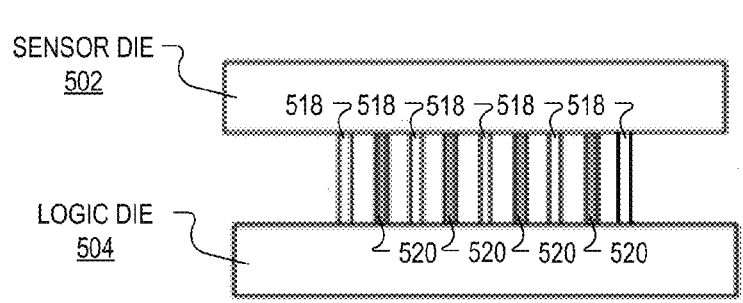
FIG. 5 is a cross section view of an example stacked imaging system with stacked first and second semiconductor dies including shield bumps disposed in corners of the pixel groupings such that there are shield bumps between the interconnections lines of pixel groupings that are read out simultaneously along a diagonals of the pixel array in accordance with the teachings of the present invention.

FIG. 5 is a cross section view of an example stacked imaging system 500 with stacked first and second semiconductor dies including shield bumps disposed in corners of the pixel groupings such that there are shield bumps between the interconnections lines of pixels that are read out simultaneously only along a diagonals of the pixel array in accordance with the teachings of the present invention. It is noted that the stacked imaging system 500 of FIG. 5 may be an example of the stacked imaging system shown in FIG. 1, and/or the stacked imaging system of FIG. 2, etc., and therefore it should be appreciated that similarly named and numbered elements referenced below are coupled and function as described above.

In particular, the example depicted in FIG. 5 shows stacked imaging system 500 including a first semiconductor die, which is labeled sensor die 502, that is stacked with and coupled to a second semiconductor die, which is labeled logic die 504. The example depicted in FIG. 5 also illustrates interconnections 518 between sensor die 502 and logic die 504, which couple the pixel cells included in the sensor die 502 to the corresponding pixel support circuits in logic die 504 as described above. In the example, it is appreciated that the cross section view of imaging system 500 is along one of the diagonals A-A' or B-B' of pixel array 406 as illustrated in FIG. 4 above. As such, there are also shield bumps 520 disposed between adjacent interconnection lines 518 along each of the diagonals A-A' and/or B-B' of the pixel array of stacked imaging system 500 in accordance with the teachings of the present invention. As such, when every other pixel cell in two rows of the pixel array included in stacked imaging system 500 are read out at a time, there is a shield bump 520 disposed the corresponding interconnect lines 518 in accordance with the teachings of the present invention. With a shield bump 518 disposed between adjacent interconnection lines 518, the coupling capacitance is eliminated to reduce unwanted interference, crosstalk, and the like, during readouts of stacked image sensor 500 in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
   a pixel array including plurality of pixel cells arranged into a plurality of rows and a plurality of columns of pixel cells in a first semiconductor die;
   a plurality of pixel support circuits arranged in a second semiconductor die, wherein the first and second semiconductor dies are stacked and coupled together;
   a plurality of interconnect lines coupled between the first and second semiconductor dies, wherein each one of the plurality of pixel cells is coupled to a corresponding one of the plurality of pixel support circuits through a corresponding one plurality of interconnect lines; and
   a plurality of shield bumps disposed proximate to corners of the pixel cells and between the first and second semiconductor dies such that each one of the plurality of shield bumps is disposed between adjacent interconnect lines along a diagonal of the pixel array and such that there is an absence of a shield bump between adjacent interconnect lines in a same row of the pixel array causing a coupling capacitance between said adjacent interconnect lines in the same row of the pixel array,
   wherein every other pixel cell in two rows of the pixel array are read out at a time such that there is said one of the plurality of shield bumps disposed between interconnect lines the diagonal that are coupled to said every other pixel cell in said two rows of the pixel array that are read out at the time.

2. The image sensor of claim 1, wherein each one of the plurality of shield bumps is disposed between adjacent interconnect lines along the diagonal of the pixel array is adapted to shield a coupling capacitance between said adjacent interconnect lines along the diagonal of the pixel array.

3. The image sensor of claim 1, wherein each one of the plurality of shield bumps is one of a dummy interconnect line, a power supply line, or a ground line.

4. The image sensor of claim 1, wherein each one of the plurality of pixel cells comprises a photodiode disposed in first semiconductor die and coupled to the corresponding interconnect line coupled to said one of the plurality of pixel cells.

5. The image sensor of claim 4, wherein each one of the plurality of pixel cells further comprises a transfer transistor disposed in the first semiconductor die and coupled between said photodiode and the corresponding interconnect line coupled to said one of the plurality of pixel cells.

6. The image sensor of claim 1, wherein each one of the plurality of pixel cells is a shared pixel comprising a plurality of photodiodes disposed in the first semiconductor die and coupled to the corresponding interconnect line coupled to said one of the plurality of pixel cells.

7. The image sensor of claim 6, wherein each shared pixel further comprises a plurality of transfer transistors, wherein each one of the plurality of transfer transistors is disposed in the first semiconductor die and coupled between one of the plurality of photodiodes and the corresponding interconnect line coupled to said one of the plurality of pixel cells.

8. The image sensor of claim 1, wherein each one of the pixel support circuits comprises:
an amplifier transistor disposed in second semiconductor die and coupled to the corresponding interconnect line coupled to said one of the plurality of pixel cells; and
a row select transistor disposed in second semiconductor die and coupled between an output of the amplifier transistor and an output bitline.

9. An imaging system, comprising:
a sensor wafer including a first semiconductor layer, wherein the sensor wafer includes a pixel array including plurality of pixel cells arranged into a plurality of rows and a plurality of columns of pixel cells in a first semiconductor layer;
a logic wafer including a second semiconductor layer, wherein the logic wafer includes a plurality of pixel support circuits arranged in a second semiconductor layer, wherein the sensor wafer and the logic wafer are stacked and coupled together;
a plurality of interconnect lines coupled between the pixel array and the plurality of pixel support circuits, wherein each one of the plurality of pixel cells in the sensor wafer is coupled to a corresponding one of the plurality of pixel support circuits in the logic wafer through a corresponding one plurality of interconnect lines; and
a plurality of shield bumps disposed proximate to corners of the pixel cells and between the sensor wafer and logic wafer such that each one of the plurality of shield bumps is disposed between adjacent interconnect lines along a diagonal of the pixel array and such that there is an absence of a shield bump between adjacent interconnect lines in a same row of the pixel array causing a coupling capacitance between said adjacent interconnect lines in the same row of the pixel array, wherein every other pixel cell in two rows of the pixel array are read out at a time such that there is said one of the plurality of shield bumps disposed between said interconnect lines along the diagonal that are coupled to said every other pixel cell in said two rows of the pixel array that are read out at the time.

10. The imaging system of claim 9, wherein the logic wafer further includes:
control circuitry disposed in the second semiconductor layer and coupled to the pixel array to control operation of the pixel array;
readout circuitry disposed in the second semiconductor layer and coupled to the plurality of pixel support circuits to readout image data from the pixel array; and
function circuitry disposed in the second semiconductor layer and coupled to the readout circuitry to store the image data readout from the pixel array.

11. The imaging system of claim 9, wherein each one of the plurality of shield bumps is disposed between adjacent interconnect lines along the diagonal of the pixel array is adapted to shield a coupling capacitance between said adjacent interconnect lines along the diagonal of the pixel array.

12. The imaging system of claim 9, wherein each one of the plurality of shield bumps is one of a dummy interconnect line, a power supply line, or a ground line.

13. The imaging system of claim 9, wherein each one of the plurality of pixel cells comprises a photodiode disposed in first semiconductor layer and coupled to the corresponding interconnect line coupled to said one of the plurality of pixel cells.

14. The imaging system of claim 13, wherein each one of the plurality of pixel cells further comprises a transfer transistor disposed in the first semiconductor layer and coupled between said photodiode and the corresponding interconnect line coupled to said one of the plurality of pixel cells.

15. The imaging system of claim 9, wherein each one of the plurality of pixel cells is a shared pixel comprising a plurality of photodiodes disposed in the first semiconductor layer and coupled to the corresponding interconnect line coupled to said one of the plurality of pixel cells.

16. The imaging system of claim 15, wherein each shared pixel further comprises a plurality of transfer transistors, wherein each one of the plurality of transfer transistors is disposed in the first semiconductor layer and coupled between one of the plurality of photodiodes and the corresponding interconnect line coupled to said one of the plurality of pixel cells.

17. The imaging system of claim 9, wherein each one of the pixel support circuits comprises:
an amplifier transistor disposed in second semiconductor die and coupled to the corresponding interconnect line coupled to said one of the plurality of pixel cells; and
a row select transistor disposed in second semiconductor die and coupled between an output of the amplifier transistor and an output bitline.

* * * * *